(12) United States Patent
Cayou et al.

(10) Patent No.: US 10,271,454 B2
(45) Date of Patent: Apr. 23, 2019

(54) SLIDING RAIL ASSEMBLIES

(71) Applicant: HEWLETT PACKARD ENTERPRISE DEVELOPMENT LP, Houston, TX (US)

(72) Inventors: Robert Eugene Cayou, Fremont, CA (US); Vance Murakami, Fremont, CA (US); Paul Wes Stelter, Fremont, CA (US); Eugene Yan Ki Hsue, Fremont, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/675,211

(22) Filed: Aug. 11, 2017

(65) Prior Publication Data
US 2019/0053398 A1    Feb. 14, 2019

(51) Int. Cl.
*H05K 7/00* (2006.01)
*H05K 7/18* (2006.01)
*H05K 7/14* (2006.01)

(52) U.S. Cl.
CPC .......... *H05K 7/183* (2013.01); *H05K 7/1487* (2013.01); *H05K 7/1489* (2013.01)

(58) Field of Classification Search
CPC .... H05K 7/183; H05K 7/1487; H05K 7/1489; A47B 88/463; A47B 88/47; A47B 88/57;
(Continued)

(56) References Cited

U.S. PATENT DOCUMENTS 2,865,684 A * 12/1958 Hahner .................... A47B 1/10
384/17
2,884,296 A *  4/1959 Meilinger .......... A47B 47/0075
312/111

(Continued)

FOREIGN PATENT DOCUMENTS

| GB | 2453326 | 4/2009 |
| SU | 1336273 | 9/1987 |
| WO | WO-2006096105 | 9/2006 |

OTHER PUBLICATIONS

Woodweb, Inc., "Wooden Dovetail Drawer Slides," (Web Page), Jun. 3, 2007, 3 pages, http://www.woodweb.com/knowledge_base/Wooden_Dovetail_Drawer_Slides.html.
(Continued)

*Primary Examiner* — Janet M Wilkens
(74) *Attorney, Agent, or Firm* — Hewlett Packard Enterprise Patent Department

(57) ABSTRACT

Examples relate to sliding rail assemblies comprising a first and a second slide rail wherein each slide rail comprises a main body and a guide rail. The main body has an inner surface to attach to an inner surface of the guide rail and an outer surface having an upper, a lower and a middle protrusion along the length of the main body. The upper and the middle protrusions define a dovetail socket and the middle and the lower protrusion define a dovetail. The main bodies of the first and the second slide rails are identical to each other. Each dovetail protrusion of the first slide rail slidably engages a corresponding dovetail protrusion of the second slide rail such that a cavity is formed between the respective guide rails. The upper protrusion of the first slide rail slidably engages the lower protrusion of the second slide rail, the lower protrusion of the first slide rail slidably engages the upper protrusion of the second slide rail and the
(Continued)

middle protrusion of the first and second slide rails engages to each other.

20 Claims, 6 Drawing Sheets

(58) Field of Classification Search
CPC .............. A47B 88/0477; A47B 88/467; A47B 88/0481; A47B 88/12; A47B 88/16; A47B 2210/0016; A47B 2210/0091
USPC ......... 312/334.7, 334.8, 223.1, 334.4, 334.5, 312/330.1
See application file for complete search history.

(56) References Cited

U.S. PATENT DOCUMENTS

| | | | |
|---|---|---|---|
| 3,059,986 A | 10/1962 | Miller, Jr. | |
| 3,160,448 A * | 12/1964 | Abernathy | A47B 88/48 312/323 |
| 3,521,938 A * | 7/1970 | Emaus | B60N 3/083 224/280 |
| 4,331,369 A * | 5/1982 | Lazar | A47B 88/427 312/334.8 |
| 5,549,377 A * | 8/1996 | Krivec | A47B 88/417 312/334.16 |
| 5,708,563 A | 1/1998 | Cranston, III et al. | |
| 6,282,791 B1 * | 9/2001 | Patelczyk | B29C 45/14 264/261 |
| 6,929,339 B1 * | 8/2005 | Greenwald | H05K 7/1421 211/26 |
| 7,287,820 B2 * | 10/2007 | Van Loon | A47B 67/04 312/249.11 |
| 7,864,538 B2 | 1/2011 | Wadsworth et al. | |
| 8,132,875 B2 * | 3/2012 | Juang | A47B 88/49 312/333 |
| 8,755,191 B2 | 6/2014 | Rebel | |
| 2008/0137232 A1 * | 6/2008 | Wadsworth | G11B 33/10 360/234.6 |
| 2011/0018414 A1 * | 1/2011 | Kim | F25D 25/025 312/402 |
| 2011/0091141 A1 * | 4/2011 | Liang | H05K 7/1489 384/20 |
| 2013/0112638 A1 * | 5/2013 | Dittus | H05K 7/1489 211/123 |
| 2014/0265790 A1 * | 9/2014 | Hashemi | F16C 29/048 312/334.8 |
| 2015/0048227 A1 * | 2/2015 | Chuang | F16B 9/023 248/228.4 |
| 2017/0055361 A1 * | 2/2017 | Muhsam | H05K 7/1489 |
| 2017/0071072 A1 | 3/2017 | Adams et al. | |
| 2017/0164507 A1 * | 6/2017 | Liao | A47B 88/044 |
| 2017/0181312 A1 * | 6/2017 | Chen | H05K 7/183 |

OTHER PUBLICATIONS

Super Micro Computer, Inc., "Superserver 6036ST-6LR User's Manual," Version 1.0c, Jan. 2, 2013, Figures from Sections 2-5 and 2-6, from pp. 2-4, 2-5, 2-6, and 2-8, <https://www.supermicro.com/manuals/superserver/3U/MNL-1186.pdf>.
Super Micro Computer, Inc., "Superserver 6036ST-6LR User's Manual," Version 1.0c, Jan. 2, 2013, Sections 2-5 and 2-6, pp. i-ii and 2-4-2-8, <https://www.supermicro.com/manuals/superserver/3U/MNL-1186.pdf>.

* cited by examiner

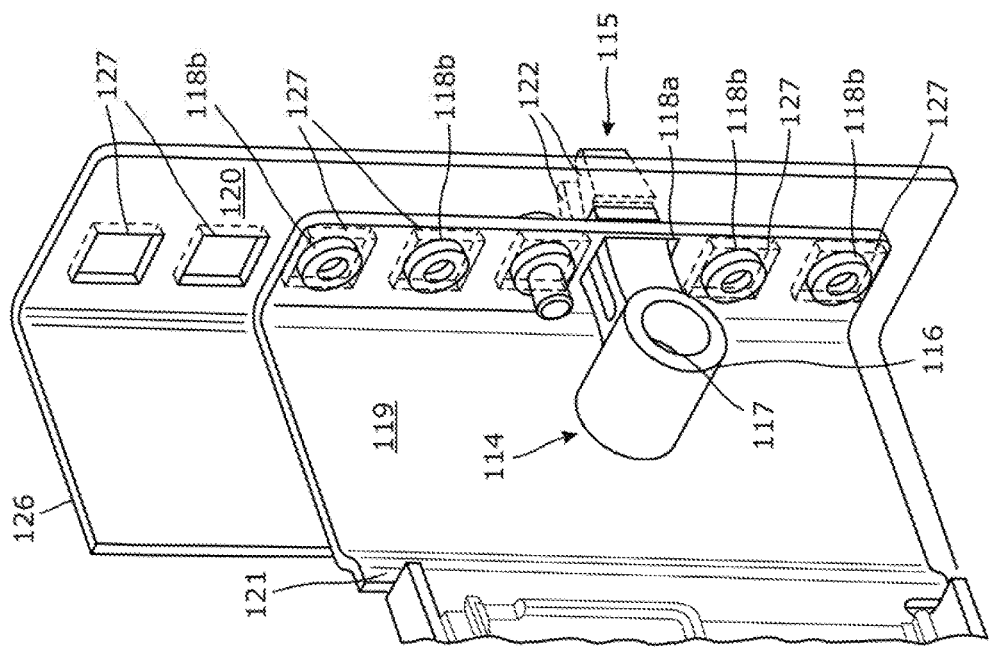
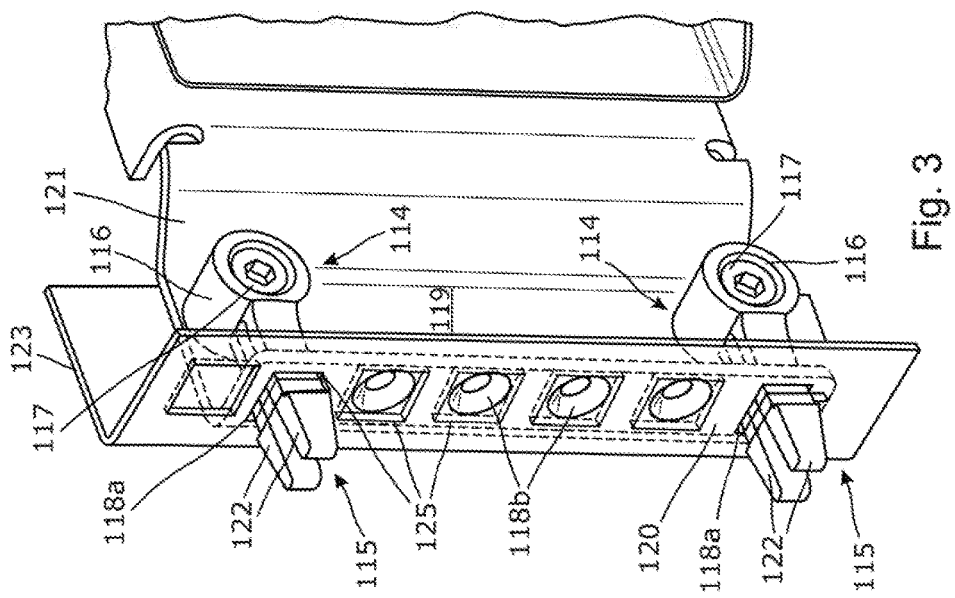

SLIDING RAIL ASSEMBLIES

BACKGROUND

A rack may be a frame or enclosure for mounting multiple electronic equipment able to provide computer services, storage services, network services, cloud services, etc. The racks may contain multiple "bays", each designed to hold a rack-mounted electronic equipment, such as a server. Typically, the electronic equipment may be mounted (inserted into a bay in the rack) and secured in place. A single rack can contain a plurality of electronic equipment, stacked one above the other, so that said electronic equipment can be conveniently accessed by users for maintenance and operation. In some examples, each stacked electronic equipment may contain one or more resource modules. The electronic equipment may be attached to the rack by slider support arrangements that may allow to move the equipment in a drawer-like manner in and out of the rack, such that said equipment may be accessed without having to remove it from the rack.

BRIEF DESCRIPTION OF THE DRAWINGS

Features of the present disclosure are illustrated by way of example and not limited in the following figure(s), in which like numerals indicate like elements, in which:

FIG. 3 is a diagram of a view of an example second fastening portion with two example mounting snaps to attach the sliding rail assembly to the rack.

FIG. 4 is a diagram of a view of an example first fastening portion with one example mounting snap to attach the sliding rail assembly to the rack.

DETAILED DESCRIPTION

Figure 1:
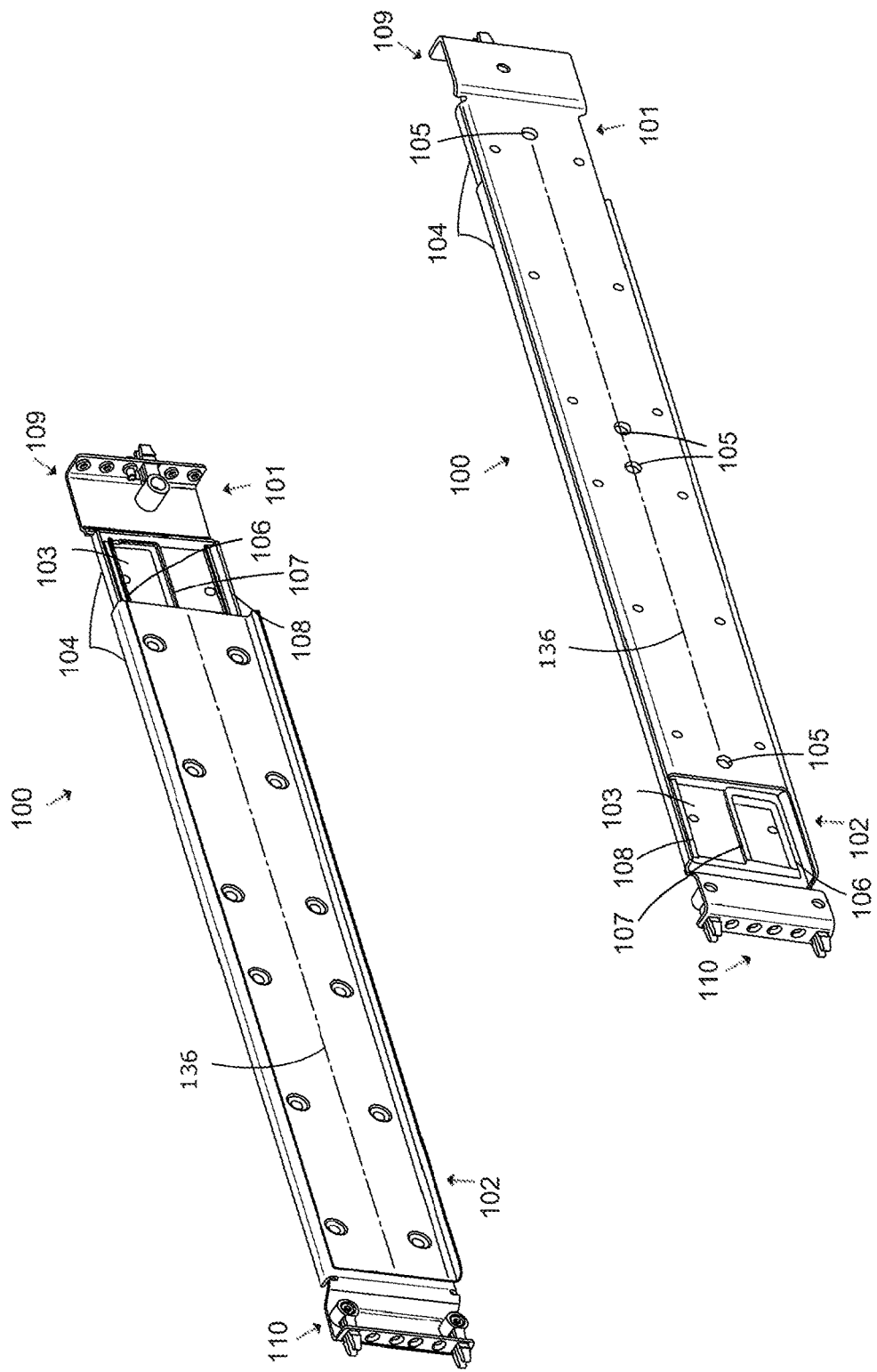
FIG. 1 is an illustration of a perspective view of example sliding rail assemblies to mount an electronic equipment into a rack, including one sliding rail assembly to be placed at each side of the electronic equipment.

Most datacenters may include racking systems where racks of said racking systems may contain a number of individually removable rack-mounted electronic equipment, particularly data handling units such as data storage units, switching units or server computer units. In some examples, each data handling unit is of a standard size. Generally, the rack-mounted electronic equipment may be mounted to a rack through a pair of extendable horizontal rail assemblies attached to the rack and to one of the sides of the rack-mounted electronic equipment.

Each one of the pair of extendable horizontal rail assemblies may at least include a rail member that may be mounted in a case, rack, housing or other framed assembly, and a slide member that may be attached to the electronic equipment, such that the slide member cooperates with the rail member and provides the extension mechanism for the drawer or shelf.

The rail member may be attached to vertical posts of the rack, using one or more of provided spaced mounting apertures or holes in each post. The posts may define mounting profiles having a set of spaced mounting apertures or holes through which the extendable horizontal rail assemblies may be attached by, for example, screw fasteners. The extendable horizontal rail assemblies may be further attached to removable rack-mounted electronic equipment on each of its sides by way of, for example, complementary protruding and recessed fasteners or screw fasteners as well. Once the electronic equipment is securely attached to the extendable horizontal rail assemblies, the electronic equipment may be pushed fully in to the rack.

However, these extendable horizontal rail assemblies may generally use complex drawer slides or two C channel rail assemblies wherein the rail member may be a C channel rail member and the slide member may be retained inside the C channel rail member. The inner slide member may be fastened to the C channel rail member by hardware elements, such as rivets. These C channel rail assemblies can present a gap between the C channel rail member and the inner slide member that may cause off-axis movement which in turn may cause wear of both members. The acceleration may also cause damages in the hardware elements fastening the slide member to the C channel rail member. Moreover, C channel rail assemblies may create high load points which may limit the durability of said assemblies.

Some other extendable horizontal rail assemblies may mount roller bearings in the slide member or the rail member to move the members relative to each other. Adding roller bearing may significantly increase the size and volume of the rail assemblies making them useless for specific designs in which there are space limitations. Moreover, the rail assemblies having roller bearings may need maintenance to avoid the roller bearing guide the bearings roll on to wear out.

To address these issues, examples described herein disclose sliding rail assemblies that may comprise a first slide rail and a second slide rail. Each slide rail of the assembly may comprise a main body and a guide rail where the main body may have an inner surface to attach to a complementary inner surface of the guide rail. The main body may further have an outer surface comprising an upper protrusion, a lower protrusion and a middle protrusion, with all these protrusions being located along the entire length of the main body, and wherein the upper protrusion and the middle protrusion define a dovetail socket and the middle protrusion and the lower protrusion define a dovetail. In such examples, the main bodies of the first slide rail and the second slide rail may be identical to each other. The protrusions of the first slide rail may further slidably engage the protrusions of the second slide rail such that the guide rail of the first slide rail and the guide rail of the second slide rail may define a cavity that, in turn, may contain the main body of the first slide rail and the main body of the second slide rail. The main bodies of the first slide rail and the second slide rail are such that the upper protrusion of the first slide rail slidably engages the lower protrusion of the second slide rail, the lower protrusion of the first slide rail slidably engages the upper protrusion of the second slide rail and the middle protrusion of the first slide rail slidably engages the middle protrusion of the second slide rail.

The sliding movement of the slide rails relative to each other may allow the sliding rail assemblies to fit into racks having different dimensions, and more particularly having different distances between the front and the rear stand columns forming the racks. The sliding rail assemblies described in such example may further increase the durability of the assembly by distributing the load of the attached electronic equipment along the upper protrusions, the lower protrusions and the middle protrusions. This may avoid the existence of load distribution points in the assembly. Besides, the main bodies of the first slide rail and the second slide rail may be identical which may be beneficial in saving manufacturing costs and making the assembly process of the two slide rails forming the sliding rail assembly easier.

In some examples, the sliding rail assembly may be bearing-free. This may reduce the volume, size and weight of the sliding rail assembly making it more appropriate for racks having a limited space to support the electronic equipment.

In some other examples, the upper protrusion may be located along the upper longitudinal edge of the main body, the lower protrusion may be located along the lower longitudinal edge of the main body and the middle protrusion may be located between the upper longitudinal edge and the lower longitudinal edge and also along the entire main body. The design of such example may make the assembly able to bare heavy electronic equipment.

In some examples, the first slide rail and the second slide rail may each be single integrated pieces. In such examples, the main body and the guide rail may be manufactured in one single integrated piece such that the mounting operation of the sliding rail assembly may be faster and easier.

In some other examples, the cavity formed by the guide rail of the first slide rail and the guide rail of the second slide rail is substantially the same size as the slidably engaged main bodies of the first and second slide rails. This may make the sliding rail assemblies to be substantially planar, reducing their thickness and making them appropriate for racks having a limited space to support the electronic equipment.

In some other examples, the dovetail defined by the middle protrusion and the lower protrusion comprises perpendicular elongated protrusions and the dovetail socket defined by the upper protrusion and the middle protrusion comprises a stopper tab at one of its ends. When the first slide rail and the second slide rail are attached to each other, the stopper tab of the dovetail socket of the first slide rail abuts against the perpendicular elongated protrusions of the dovetail of the second slide rail and the stopper tab of the dovetail socket of the second slide rail abuts against the perpendicular elongated protrusions of the dovetail of the first slide rail.

As referred to herein, the term "rack" should be broadly construed. A rack may refer to be a frame or enclosure for mounting multiple electronic equipment, such as a computing devices (e.g., a server). As an example, a rack may have an inner space for storing the electronic equipment. Electronic equipment for placement in a rack assembly may refer to rack-mounted system or rack mountable. For example, an industry standard rack cabinet may be 42 U tall.

As referred to herein, the term "electronic equipment" should be broadly construed. For example, the electronic equipment may be any type of conventional computing unit such as a server, a storage unit, a power unit, a computer, etc. Electronic equipment may be stored within a rack as described by the examples set forth herein. As an example, a server is typically configured to run an instance of software that is capable of accepting requests from clients, and the computing device that executes such software. Clients may run on the same computer, but typically connect to the server through a network.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples.

Turning now to the figures, FIG. 1 shows an illustration of a perspective view of example sliding rail assemblies 100 to mount an electronic equipment into a rack, including one sliding rail assembly 100 to be placed at each side of the electronic equipment (not shown in the figure). It should be understood that the sliding rail assemblies 100 depicted in FIG. 1 may include additional components and that some of the components described herein may be removed and/or modified without departing from a scope of the slide rail assemblies 100. Additionally, implementation of the sliding rail assemblies 100 is not limited to such example.

Each sliding rail assembly 100 comprises a first slide rail 101 and a second slide rail 102 which are attached to each other. Each slide rail comprises a main body 103 and a guide rail 104. An inner surface of the main body 103 contacts a complementary inner surface of the guide rail 104 to which is attached by, e.g., rivets 105. In some other examples, the main body 103 may be attached to the guide rail 104 by any appropriate attachment able to support the weight of the electronic equipment, such as screws, bolts, or clips. The main body 103 has an outer surface having an upper protrusion 106, a lower protrusion 108 and a middle protrusion 107 along at least part of the length of the main body 103. The upper protrusion 106 and the middle protrusion 107 define a dovetail socket and the middle protrusion 107 and the lower protrusion 108 define a dovetail. The dovetail socket and the dovetail are defined by the orientation of the protrusions 106-108 relative to the longitudinal axis 136 of the main body 103.

In such example, while the main body 103 of the first slide rail 101 and the main body 103 of the second slide rail 102 are identical to each other, the guide rail 104 of the first slide rail 101 is slightly smaller than the guide rail 104 of second slide rail 102 such that the first slide rail 101 slidably moves within the second slide rail 102. In particular, the upper protrusion 106 of the first slide rail 101 slidably engages the lower protrusion 108 of the second slide rail 102, the lower protrusion 108 of the first slide rail 101 slidably engages the upper protrusion 106 of the second slide rail 102 and the middle protrusion 107 of the first slide rail 107 slidably engages the middle protrusion 107 of the second slide rail 102. In this way, the load supported by the slide rail assemblies 100 is shared through the whole length of the main bodies of the assemblies 100.

The protrusions 106-108 engage to each other such that a cavity is formed between the guide rail 104 of the first slide rail 101 and the guide rail 104 of the second slide rail 102. In some examples, this cavity is substantially the same size as the slidably engaged main bodies 103 of the first and second slide rails 101,102. This allows these sliding rail assemblies 100 to be used in racks with limited space, at the same time that they are able to bear heavy electronic equipment.

The first slide rail 101 further comprises a first fastening portion 109 at one of its ends to be fastened to a stand column of a rack (not shown in this figure), for example a rear stand column of a rack. The rear stand column may have a bracket profile and a planar surface with spaced mounting holes for receiving correspondingly shaped fastening elements in the form of rivets, hooks, snaps, screw/nut fasteners, etc., for fastening the first fastening portion 109 to the rear stand column. This first fastening portion 109 forms a right angle with the longitudinal axis 136 of the first slide rail 101 defining a planar surface having spaced mounting holes in correspondence with the spaced mounting holes in the rear stand column of the rack. Similarly, the second slide rail 102 further comprises a second fastening portion 110 at one of its ends to be fastened to a stand column of a rack (not shown in this figure), for example a front stand column of a rack. The front stand column may have a bracket profile and a planar surface with spaced mounting holes for receiving correspondingly shaped fastening elements in the form of rivets, hooks, snaps, screw/nut fasteners, etc., for fastening the second fastening portion 110 to the rear stand column. This second fastening portion 110 also forms a right angle with the longitudinal axis 136 of the second slide rail 102 defining a planar surface having spaced mounting holes in correspondence with the spaced mounting holes in the front stand column of the rack.

Figure 2:
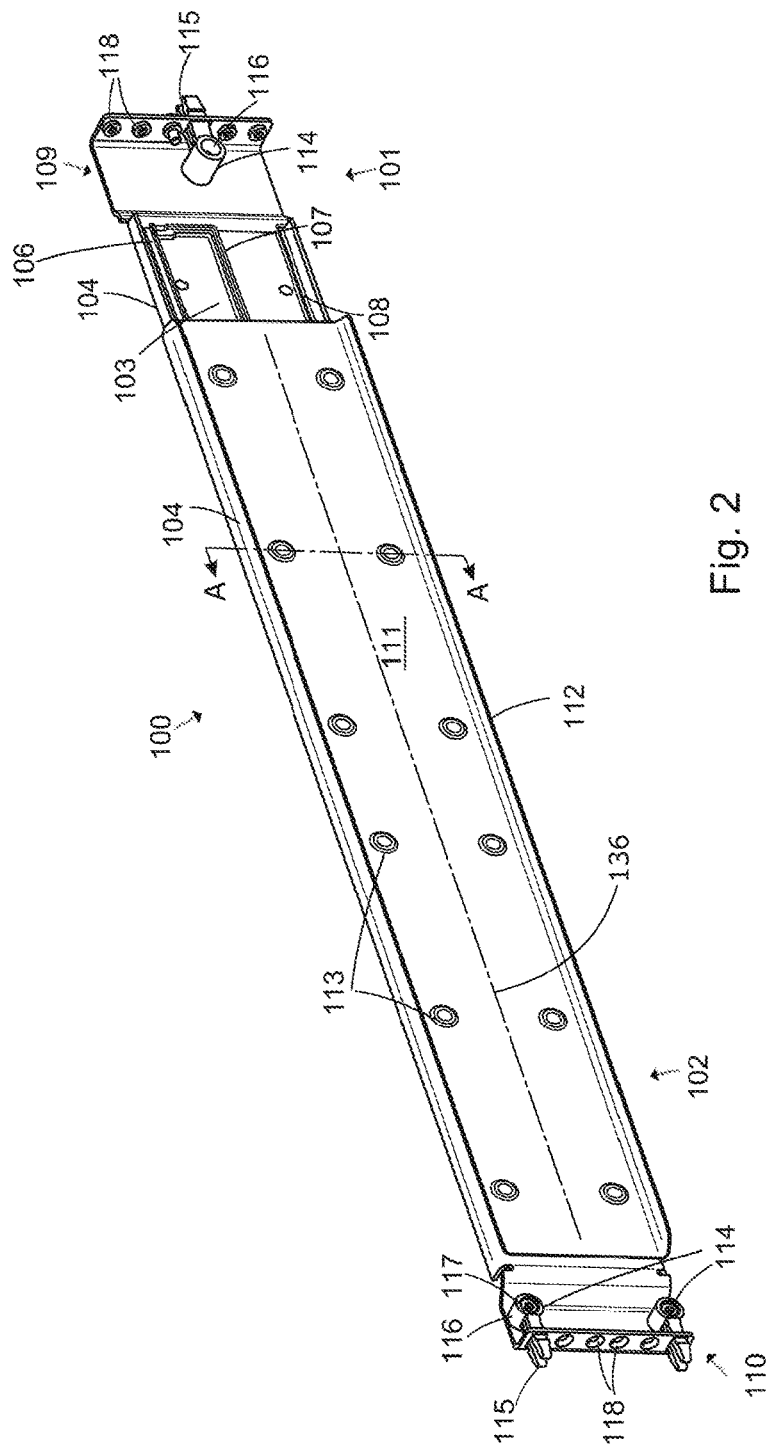
FIG. 2 is an illustration of a perspective view of one of the example sliding rail assemblies of FIG. 1.

FIG. 2 is an illustration of a perspective view one of the example sliding rail assemblies of FIG. 1. It should be understood that the sliding rail assembly 100 depicted in FIG. 2 may include additional components and that some of the components described herein may be removed and/or modified without departing from a scope of the sliding rail assemblies 100. Additionally, implementation of the sliding rail assemblies 100 is not limited to such example.

The sliding rail assembly 100 further comprises a supporting portion 111 attached to the outer surface of the guide rail 104 of the second slide rail 102. This supporting portion 111 is attached to the guide rail 104 by sixteen rivets 113 located in two rows, a first row of eight rivets in proximity to the upper edge of the guide rail 104 and a second row of other eight rivets in proximity to a lower edge of the guide rail 104. In some other examples, other attachments, such as rivets or screws, could be used to couple the supporting portion 111 to the outer surface of the guide rail 104. The supporting portion 111 comprises a lower portion 112 that forms a right angle with the longitudinal axis 136 of the guide rail 104. The lower portions 112 of the two facing sliding rail assemblies 100 (as shown in FIG. 1) support the electronic equipment when it is inserted into the rack. The dimensions of the lower portion 112 may vary depending on the dimensions and weight of the electronic equipment that is to be inserted into the rack. In some other examples, the electronic equipment may be attached to the supporting portions 111 of the sliding rail assemblies 100 with rivets, screws or other suitable fastening equipment.

The sliding rail assembly 100 further comprises one mounting snap 114 to fasten the first fastening portion 109 to the rear stand column of the rack and two mounting snaps 114 to fasten the second fastening portion 110 to an opposite stand column of the rack, for example the corresponding front stand column of the rack. These mounting snaps 114 have a main tubular body 116 and an elongated body 115 that is inserted in the holes 118 of the respective first and second fastening portions 109,110. The mounting snaps 114 are coupled to the first and second fastening portions 109, 110 via the tubular body 116 by screws 117.

FIG. 3 is a diagram of a view of an example second fastening portion 110 with two example mounting snaps 114 to attach the sliding rail assembly 100 to the rack. It should be understood that the second fastening portion 110 and the mounting snaps 114 depicted in FIG. 3 may include additional components and that some of the components described herein may be removed and/or modified without departing from a scope of the second fastening portion 110 and the mounting snaps 114, respectively. Additionally, implementation of the second fastening portion 110 and the mounting snaps 114 is not limited to such example.

The second fastening portion 110 comprises a first portion 120, a second portion 119 and a third portion 121. The third portion 121 interconnects the second portion 119 with the main portion 122 of the guide rail 104 and has a surface inclined relative to the main portion 122. The second portion 119 interconnects the first portion 120 with the third portion 121 and has a surface substantially parallel to the main portion 122 of the geode rail 104. The first portion 120 comprises mounting holes 118 and forms a right angle with the longitudinal axis of the main portion 122 defining a planar surface having mounting holes. In such example, the mounting holes 118 are square mounting holes 118a for attaching the second slide rail to the front stand column 123 of the rack, and circular holes 118b to attach the electronic equipment to the sliding rail assembly 100. The front stand column 123 is bracket shaped and has a first surface in correspondence to the first portion 120 and with mounting holes 125 corresponding to the mounting holes 118 of the first portion 120 and a second surface complementary to the second portion 119. The mounting snaps 114 for attaching the second slide rail 102 to the front stand column 123 have a tubular body 116 and an elongated body 115 that in turn comprises two flexible hook-shaped elongated protrusion 124. The elongated body 115 is firstly inserted in to the square holes 118b and then is attached to the second portion 119 by a screw 117 via the tubular body 116. The hook-shaped elongated protrusions 124 are then inserted into the corresponding mounting holes 125 of the front stand column 123.

The electronic equipment (not shown in the figure) may be attached to the front stand column 123 of the rack and also to the second slide rail 102 via the frontal panel of the chassis of the equipment. This frontal panel may have ears (protruding tabs at each side of the front panel of the chassis of the electronic equipment). The ears may further comprises spaced mounting holes in correspondence with the mounting holes 125 of the front stand column 123 and with the mounting holes 118b of the first portion 120, such that the electronic equipment may be attached by, for example, bolts and nuts or any other equivalent attachments. Thus, the chassis of the electronic equipment is bolted to the front stand column 123, the rack and to the second slide rail 102.

While FIG. 3 shows two mounting snaps 114 to attach the sliding rail assembly 100 to the rack, any other number of the mounting snaps 114 may be used.

FIG. 4 is a diagram of an example first fastening portion 109 with one example mounting snap 114 to attach the sliding rail assembly 100 to the rack. It should be understood that the first fastening portion 109 and the mounting snaps 114 depicted in FIG. 4 may include additional components and that some of the components described herein may be removed and/or modified without departing from a scope of the first fastening portion 109 and the mounting snaps 114, respectively. Additionally, implementation of the first fastening portion 109 and the mounting snaps 114 is not limited to such example.

The first fastening portion 109 also comprises a first portion 120, a second portion 119 and a third portion 121. The third portion 121 interconnects the second portion 119 with the main portion 122 of the guide rail 104 and has a surface inclined relative to the main portion 122. The second portion 119 interconnects the first portion 120 with the third portion 121 and has a surface substantially parallel to the main portion 122. The first portion 120 forms a right angle with the longitudinal axis of the main portion 122 defining a planar surface having spaced mounting holes 118. In such example, the mounting holes 118 are square mounting holes 118a for attaching the second slide rail to the rear stand column 126 of the rack, and circular holes 118b to attach the electronic equipment to the sliding rail assembly 100. The rear stand column 126 has a bracket profile and a first surface corresponding to the first portion 120 and with mounting holes 127 corresponding to the mounting holes 118 of the first portion 120 and a second surface complementary to the second portion 119. The mounting snaps 114 for attaching the first slide rail 101 to the rear stand column 126 have a tubular body 116 and an elongated body 115 that in turn comprises two flexible hook-shaped elongated protrusions 124. The elongated body 115 is firstly inserted in to the square holes 118b and then is attached to the second portion 119 by a screw 117 via the tubular body 116. The hook-shaped elongated protrusions 124 are then inserted into the corresponding mounting holes 127 of the rear stand column 126.

The electronic equipment (not shown in the figure) may be also attached to the rear stand column 126 of the rack and also to the first slide rail 101 via the back panel of the chassis of the equipment. The back panel may have ears (protruding tabs at each side of the back panel of the chassis of the electronic equipment). The ears may further comprises spaced mounting holes in correspondence with the mounting holes 127 of the rear stand column 125 and with the mounting holes 118b of the first portion 120, such that the electronic equipment may be attached by, for example, bolts and nuts or any other equivalent attachments. Thus, the chassis of the electronic equipment is bolted to the rear stand column 126, the rack and to the first slide rail 101.

While FIG. 4 shows one mounting snap 114 to attach the slide rail assembly 100 to the rack, any other number of the mounting snaps 114 may be used.

Figure 5:
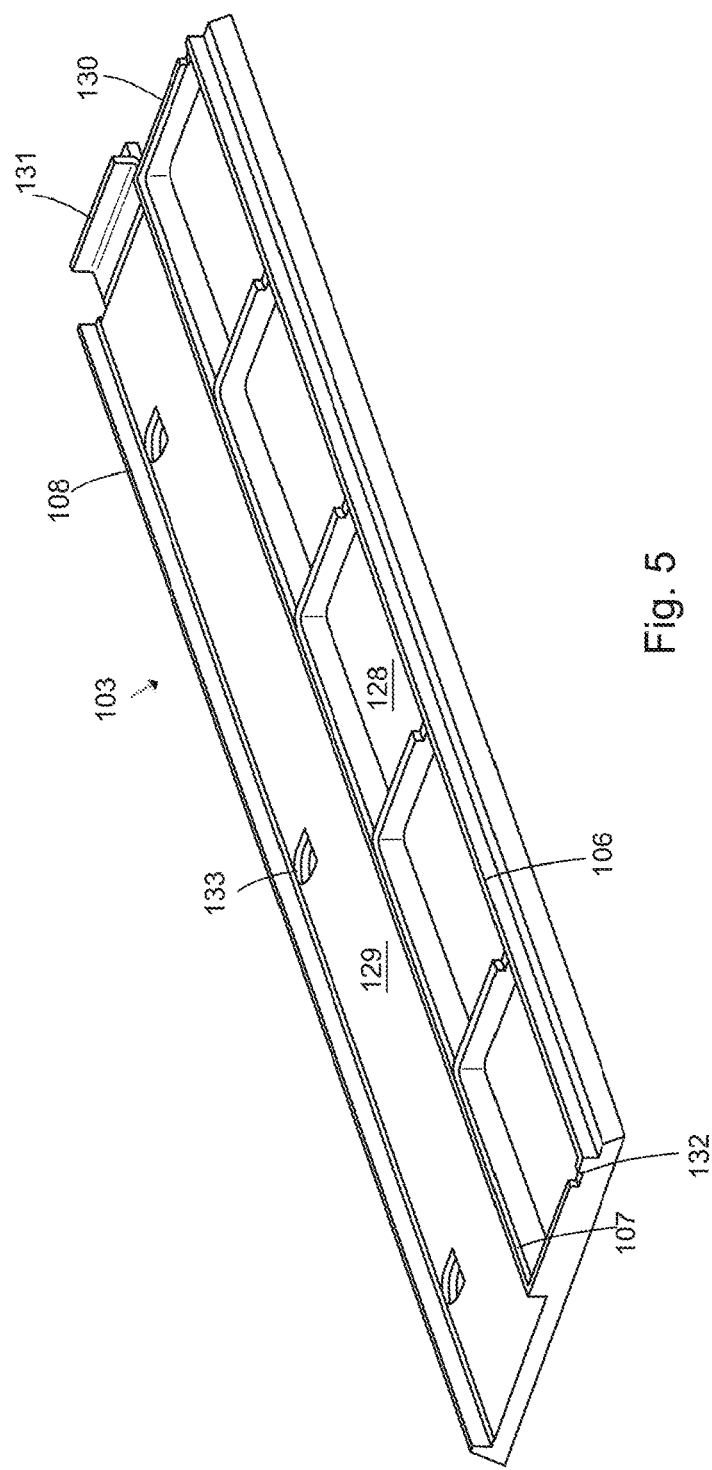
FIG. 5 is a diagram of a perspective view of an example main body of the sliding rail assemblies.

FIG. 5 is a diagram of a perspective view of an example main body 103 of the sliding rail assemblies 100. It should be understood that the main body 103 depicted in FIG. 5 may include additional components and that some of the components described herein may be removed and/or modified without departing from a scope of the main body 103. Additionally, implementation of the main body 103 is not limited to such example.

In such example, the main body 103 has an outer surface comprising an upper protrusion 106, a lower protrusion 108 and a middle protrusion 107 along the entire length of the main body 103. The upper protrusion 106 and the middle protrusion 107 define a dovetail socket 128 and the middle protrusion 107 and the lower protrusion 108 define a dovetail 129. The protrusions 106-108 are made of nylon reinforced fiber so said protrusions 106-108 can be small enough to reduce the width of the main body 103, and in turn, the width of the cavity defined by the main bodies 103 of the first and second slide rails 101,102, but strong enough to support heavy electronic equipment.

The dovetail 128 defined by the middle protrusion 107 and the upper protrusion 106 comprises perpendicular elongated protrusions 130 and the dovetail socket 129 defined by the lower protrusion 108 and the middle protrusion 107 comprises a stopper tab 131 at one of its ends of the dovetail socket 129. In such example, when the main bodies 103 of the first and second slide rails 101,102 are attached to each other by the respective protrusions 106-108, the dovetail socket 129 of the first slide rail 101 engages to the dovetail 128 of the second slide rail 102 and the dovetail socket 129 of the second slide rail 102 engage to the dovetail 128 of the first slide rail 102. Moreover, the stopper tabs 131 of the respective dovetail sockets 129 abuts against the perpendicular elongated protrusions 130 of the respective dovetails 128. The stopper tabs 131 abutting against the perpendicular elongated protrusions 130 prevent over extending and collapsing of the sliding rail assembly 100.

The dovetail socket 129 comprises holes 133 to attach the main body 103 to the guide rail 104. The dovetail 128 also comprises through holes 133 (not shown in the figure) to securely couple the main body 103 to the guide rail 104. Moreover, the perpendicular elongated protrusions 130 comprise a recess 132 located in correspondence with the rivets (not shown in the figure) that fix the main body 103 to the guide rail 104 in the opposite slide rail, such that the abutment of the perpendicular elongated protrusions 130 against the head of these rivets is avoided.

While FIG. 5 shows six perpendicular elongated protrusions 130 equidistantly located along the main body 103, in some other examples the main body 103 may have any number of perpendicular elongated protrusions 130 located at different intervals along its entire length.

Figure 6:
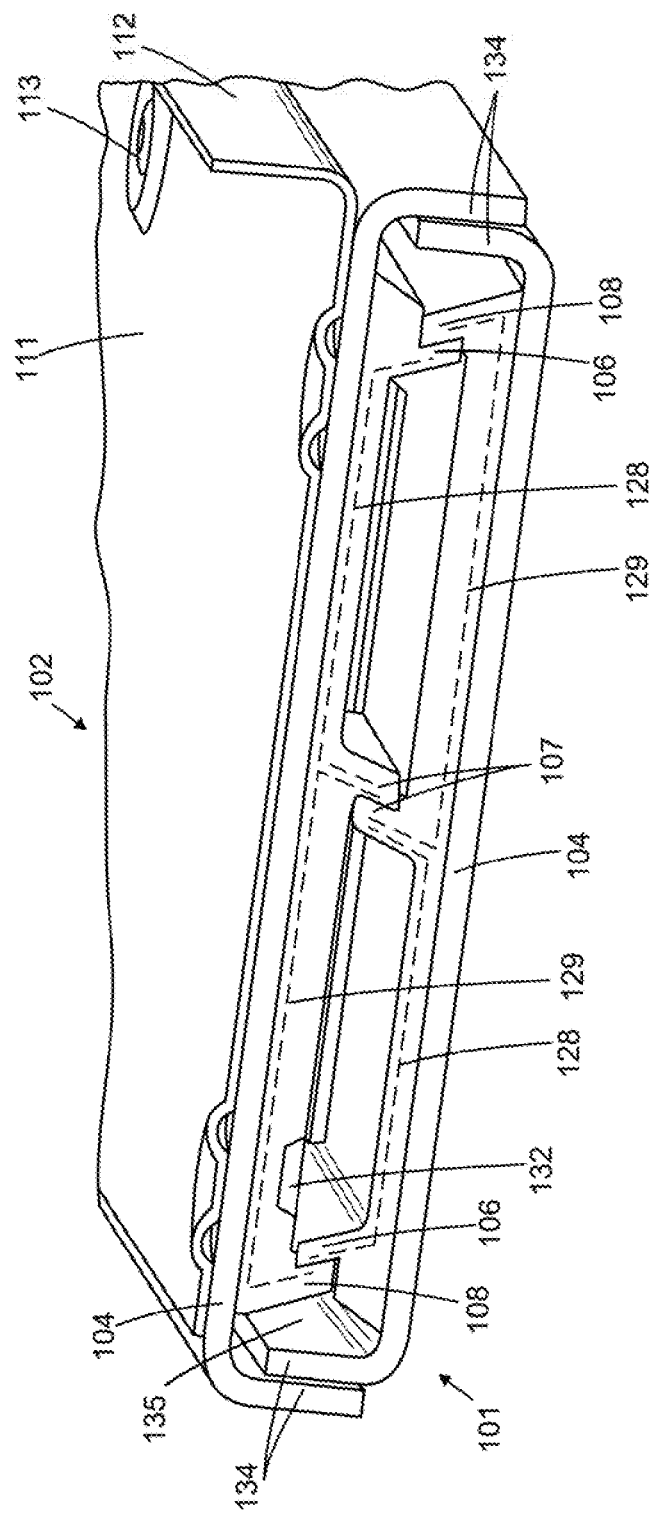
FIG. 6 is an example cross sectional view of the example sliding rail assembly along line A-A in FIG. 2.

FIG. 6 is an example cross sectional view of the example sliding rail 100 assembly along line A-A in FIG. 2. It should be understood that the sliding rail assembly 100 depicted in FIG. 6 may include additional components and that some of the components described herein may be removed and/or modified without departing from a scope of the sliding rail assembly 100. Additionally, implementation of the sliding rail assembly 100 is not limited to such example.

The guide rails have a U-shaped profile having a main portion 122 and two side portions 134. The protrusions 106-108 engage to each other such that a cavity 135 is formed between the guide rail 104 of the first slide rail 101 and the guide rail 104 of the second slide rail 102. In some examples, this cavity 135 is substantially the same size as the slidably engaged main bodies 103 of the first and second slide rails 101,102.

In such example, the upper protrusion 108 and the middle protrusion 107 are inwardly inclined relative to the portion of the bottom surface of the main body 103 between both protrusions 107,108, defining the dovetail socket 129 (see dotted line). Moreover, the middle protrusion 107 and the lower protrusion 106 are outwardly inclined relative to the portion of the bottom surface of the main body 103 between both protrusions 106,107, defining the dovetail 128 (see dotted line).

Figure 7:
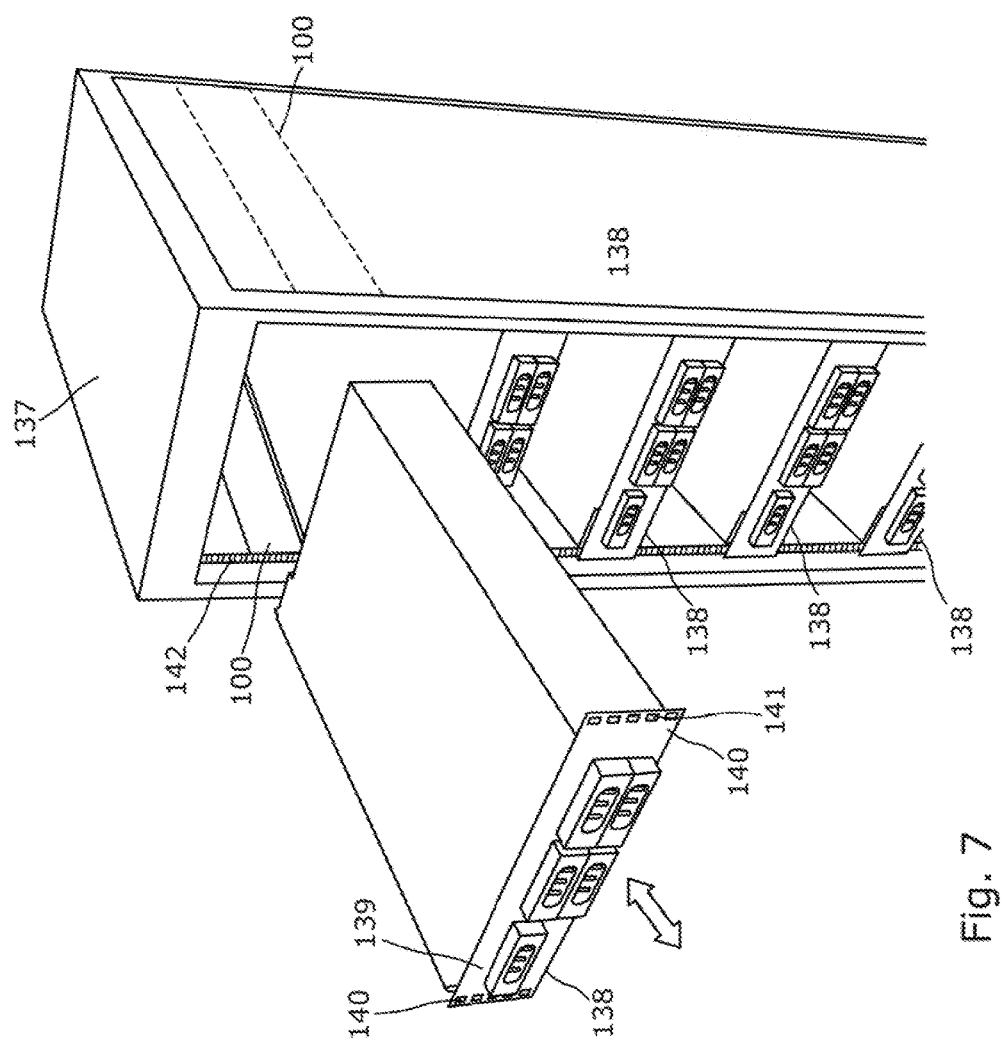
FIG. 7 is an illustration of a perspective view of a rack including sliding rail assemblies to support electronic equipment.

FIG. 7 is an illustration of a perspective view of a rack 137 including sliding rail assemblies 100 to support electronic equipment 138. It should be understood that the rack 137, the sliding rail assemblies 100 and the electronic equipment 138 depicted in FIG. 7 may include additional components and that some of the components described herein may be removed and/or modified without departing from a scope of the rack 137, the sliding rail assemblies 100 and the electronic equipment 138. Additionally, implementation of the the rack 137, the sliding rail assemblies 100 and the electronic equipment 138, is not limited to such example.

In such figure, the top-most electronic equipment 138, e.g. a server, is shown as being fully withdrawn from its bay while the other servers 138 are positioned in their respective bays and attached, via their front panels 139, to the rack 137. FIG. 7 also shows the sliding rail assemblies 100, as shown in FIG. 1, of the top-most server 138, for allowing the server to be supported within its space in the rack 137.

The front panels 139 of the servers 138 comprise ears 140 with mounting holes 141 located in correspondence with the mounting holes of the front stand columns 142 and with the mounting holes of the sliding rail assemblies 100. The servers 138 may be attached to the rack 137 using first connectors to releasable attach the first slide rail to at least one of the plurality of the stand columns and second connectors to releasable attach the second slide rail to a different stand column. These first and second connectors may be rivets, bolts and nuts or any other equivalent attachment.

The sliding rail assemblies as described herein reduce the acceleration in a dynamic mode, increase the strength durability of the assembly by distributing the load generated by the supported electronic equipment, reduces the space used by the assembly at the same time that it can bare high weights. The sliding rail assemblies also reduces the costs associated to their manufacturing process and makes their mounting operation easy. Moreover, the sliding rail assemblies prevent over extending and collapsing and reduce the time for mounting the assembly into the racks.

The invention claimed is:

1. A sliding rail assembly comprising:
    a first slide rail and a second slide rail, each slide rail comprising a main body having an inner surface comprising, along the length of the main body:
        an upper protrusion located at an upper longitudinal edge of the main body;
        a lower protrusion located at a lower longitudinal edge of the main body; and
        a middle protrusion located between the upper longitudinal edge and the lower longitudinal edge, wherein the upper protrusion and the middle protrusion define a dovetail socket and the middle protrusion and the lower protrusion define a dovetail;
    wherein the main bodies of the first slide rail and the second slide rail are identical to each other and each protrusion of the first slide rail slidably engages a corresponding protrusion of the second slide rail; and
    wherein the upper protrusion of the first slide rail slidably engages the lower protrusion of the second slide rail, the lower protrusion of the first slide rail slidably engages the upper protrusion of the second slide rail and the middle protrusion of the first slide rail slidably engages the middle protrusion of the second slide rail.

2. The sliding rail assembly of claim 1, wherein the sliding rail assembly is bearing-free.

3. The sliding rail assembly of claim 1, wherein a guide rail of the first slide rail comprises a first fastening portion to be fastened to a stand column of a rack and a guide rail of the second slide rail comprises a second fastening portion to be fastened to a different stand column of the rack.

4. The sliding rail assembly of claim 3, wherein the first fastening portion and the second fastening portion form a right angle with a longitudinal axis of the first slide rail and the second slide rail, respectively.

5. The sliding rail assembly of claim 4, comprising a first mounting snap to fasten the first fastening portion to the stand column of the rack and second mounting snaps to fasten the second fastening portion to the different stand column of the rack.

6. The sliding rail assembly of claim 1, comprising a supporting portion attached to an outer surface of a guide rail of the second slide rail to hold electronic equipment.

7. The sliding rail assembly of claim 1, wherein, for each of the first and second slide rails: the dovetail defined by the middle protrusion and the lower protrusion comprises perpendicular elongated protrusions and the dovetail socket defined by the upper protrusion and the middle protrusion comprises a stopper tab at one of the ends of the dovetail socket.

8. The sliding rail assembly of claim 7, wherein, for each of the first and second slide rails: the perpendicular elongated protrusions are located at different intervals along the length of the main body.

9. The sliding rail assembly of claim 7, wherein the stopper tab of the first slide rail is to abut against one of the perpendicular elongated protrusions of the second slide rail.

10. The sliding rail assembly of claim 1, wherein the protrusions are made of nylon reinforced fiber.

11. The sliding rail assembly of claim 1, wherein the first slide rail is a single integrated piece and the second slide rail is a single integrated piece.

12. The sliding rail assembly of claim 1, wherein a cavity formed by a guide rail of the first slide rail and a guide rail of the second slide rail is substantially the same size as the slidably engaged main bodies of the first and second slide rails.

13. The sliding rail assembly of claim 1, wherein the upper protrusion and the middle protrusion are inwardly inclined relative to a bottom surface of the dovetail socket and the middle protrusion and the lower protrusion are outwardly inclined relative to a bottom surface of the dovetail.

14. A sliding rail assembly comprising:
    a first slide rail and a second slide rail, each slide rail comprising a main body and a guide rail, wherein each main body has an inner surface to attach to a complementary inner surface of one of the guide rails and an outer surface having, along the length of the main body:
        an upper protrusion located at an upper longitudinal edge of the main body;
        a lower protrusion located at a lower longitudinal edge of the main body; and
        a middle protrusion located between the upper longitudinal edge and the lower longitudinal edge, wherein the upper protrusion and the middle protrusion define a dovetail socket and the middle protrusion and the lower protrusion define a dovetail;
    wherein the main bodies of the first slide rail and the second slide rail are identical to each other and each protrusion of the first slide rail slidably engages a corresponding protrusion of the second slide rail such that a cavity is formed by the guide rail of the first slide rail and the guide rail of the second slide rail, the cavity containing the main body of the first slide rail and the main body of the second slide rail;
    wherein the upper protrusion of the first slide rail slidably engages the lower protrusion of the second slide rail, the lower protrusion of the first slide rail slidably engages the upper protrusion of the second slide rail and the middle protrusion of the first slide rail slidably engages the middle protrusion of the second slide rail.

15. The sliding rail assembly of claim 14, wherein the guide rail of the first slide rail comprises a first fastening portion to be fastened to a stand column of a rack and the guide rail of the second slide rail comprises a second fastening portion to be fastened to an opposite stand column of the rack.

16. The sliding rail assembly of claim 14, comprising a supporting portion attached to an outer surface of the guide rail of the second slide rail to hold electronic equipment.

17. The sliding rail assembly of claim 14, wherein the cavity formed by the guide rail of the first slide rail and the guide rail of the second slide rail is substantially the same size as the slidably engaged main bodies of the first and second slide rails.

18. The sliding rail assembly of claim 14, wherein:
each protrusion of the first slide rail slidably engages the corresponding protrusion of the second slide rail such that a cavity is formed by the guide rail of the first slide rail and the guide rail of the second slide rail, the cavity containing the main body of the first slide rail and the main body of the second slide rail; and
the sliding rail assembly is bearing-free.

19. A sliding rail assembly comprising:
a first slide rail and a second slide rail, each slide rail comprising a main body having an inner surface comprising, along the length of the main body:
an upper protrusion;
a lower protrusion; and
a middle protrusion, wherein the upper protrusion and the middle protrusion define a dovetail socket and are inwardly inclined relative to a bottom surface of the dovetail socket, and wherein the middle protrusion and the lower protrusion define a dovetail and are outwardly inclined relative to a bottom surface of the dovetail, and wherein the dovetail is concave between the middle and lower protrusions;
wherein the main bodies of the first slide rail and the second slide rail are identical to each other and each protrusion of the first slide rail slidably engages a corresponding protrusion of the second slide rail;
wherein the upper protrusion of the first slide rail slidably engages the lower protrusion of the second slide rail, the lower protrusion of the first slide rail slidably engages the upper protrusion of the second slide rail and the middle protrusion of the first slide rail slidably engages the middle protrusion of the second slide rail.

20. A rack assembly comprising:
a server rack comprising a plurality of stand columns, defining a plurality of server spaces for receiving a plurality of servers, and defining an opening for access of the server spaces;
a sliding rail assembly for the server spaces, wherein each sliding rail assembly comprises:
a first slide rail and a second slide rail, each slide rail comprising a main body having an inner surface comprising, along the length of the main body:
an upper protrusion located at an upper longitudinal edge of the main body;
a lower protrusion located at a lower longitudinal edge of the main body; and
a middle protrusion located between the upper longitudinal edge and the lower longitudinal edge, wherein the upper protrusion and the middle protrusion define a dovetail socket and the middle protrusion and the lower protrusion define a dovetail;
wherein the main bodies of the first slide rail and the second slide rail are identical to each other and each protrusion of the first slide rail slidably engages a corresponding protrusion of the second slide rail; and
wherein the upper protrusion of the first slide rail slidably engages the lower protrusion of the second slide rail, the lower protrusion of the first slide rail slidably engages the upper protrusion of the second slide rail and the middle protrusion of the first slide rail slidably engages the middle protrusion of the second slide rail.

* * * * *